US012751233B2

(12) United States Patent
Sankar et al.

(10) Patent No.: US 12,751,233 B2
(45) Date of Patent: Sep. 29, 2026

(54) METHOD TO PERFORM IN-SITU VACUUM CONTAMINATION MEASUREMENT AND IDENTIFICATION IN ARBITRARILY LARGE CHAMBERS

(71) Applicant: KLA Corporation, Milpitas, CA (US)

(72) Inventors: Santosh Kumar Sankar, San Jose, CA (US); Makfir Sefa, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/812,757

(22) Filed: Aug. 22, 2024

(65) Prior Publication Data

US 2025/0096010 A1 Mar. 20, 2025

Related U.S. Application Data

(60) Provisional application No. 63/675,094, filed on Jul. 24, 2024, provisional application No. 63/538,504, filed on Sep. 15, 2023.

(51) Int. Cl.
*H10P 72/00* (2026.01)

(52) U.S. Cl.
CPC ...... *H10P 72/0402* (2026.01); *H10P 72/0604* (2026.01)

(58) Field of Classification Search
CPC ......... H01L 21/67017; H01L 21/67253; H10P 72/0402; H10P 72/0604
USPC ........................................................ 137/15.18
See application file for complete search history.

(56) References Cited

U.S. PATENT DOCUMENTS 4,857,136 A * 8/1989 Zajac ........................ C23C 16/52 118/712
6,696,362 B2 2/2004 Rossman et al.
6,911,347 B2 6/2005 Higgs
8,953,145 B2 2/2015 Kraus et al.
(Continued)

FOREIGN PATENT DOCUMENTS

JP 08-188495 A 7/1996
JP 08-327615 A 12/1996
(Continued)

OTHER PUBLICATIONS

WIPO, International Search Report and Written Opinion issued for PCT/US2024/045451, Dec. 20, 2024.

*Primary Examiner* — Minh Q Le
(74) *Attorney, Agent, or Firm* — Hodgson Russ LLP

(57) ABSTRACT

The system includes a primary vacuum chamber and a secondary vacuum chamber connected to the primary vacuum chamber via a gate valve. The gate valve operates between an open position in which the secondary vacuum chamber is in fluid communication with the primary vacuum chamber and a closed position in which the secondary vacuum chamber is sealed from the primary vacuum chamber. A heat exchanger cools the secondary vacuum chamber to adsorb contaminants from the primary vacuum chamber into the secondary vacuum chamber when the gate valve is in the open position. A gas source injects a carrier gas into the secondary vacuum chamber when the gate valve is in the closed position. The heat exchanger also heats the carrier gas in the secondary vacuum chamber to desorb the contaminants into a gas sample with the carrier gas. A sample container collects the gas sample from the secondary vacuum chamber.

19 Claims, 7 Drawing Sheets

(56) References Cited

U.S. PATENT DOCUMENTS

| | | | | |
|---|---|---|---|---|
| 9,494,879 | B2 | 11/2016 | Luijten | |
| 11,036,202 | B2 * | 6/2021 | Sadeghi | G05B 19/4065 |
| 11,049,704 | B1 * | 6/2021 | Ruach-Nir | H01J 37/18 |
| 2005/0041238 | A1 * | 2/2005 | Ludviksson | H01J 37/32935 356/72 |
| 2008/0196515 | A1 | 8/2008 | Lee et al. | |
| 2009/0217634 | A1 * | 9/2009 | Choi | H01L 21/67017 55/428.1 |
| 2011/0048143 | A1 * | 3/2011 | Favre | H01L 21/67389 73/864.35 |
| 2011/0056913 | A1 * | 3/2011 | Mayer | C25C 7/00 216/84 |
| 2014/0290859 | A1 * | 10/2014 | Kobayashi | H01L 21/67017 156/345.15 |
| 2016/0273830 | A1 | 9/2016 | Park et al. | |
| 2018/0179627 | A1 * | 6/2018 | Yamasaki | C23C 16/4586 |
| 2018/0353876 | A1 * | 12/2018 | Chen | B01D 19/0036 |
| 2019/0362989 | A1 * | 11/2019 | Reuter | H01L 21/67109 |
| 2021/0129170 | A1 * | 5/2021 | Wei | C23C 16/4412 |
| 2021/0366734 | A1 * | 11/2021 | Lee | C23C 16/4412 |
| 2022/0112598 | A1 | 4/2022 | Tyer et al. | |
| 2022/0384063 | A1 * | 12/2022 | Kimtee | B01J 4/001 |
| 2023/0066693 | A1 | 3/2023 | Tsao et al. | |
| 2023/0369030 | A1 * | 11/2023 | Zhu | H01J 37/32633 |
| 2024/0055278 | A1 * | 2/2024 | Ogawa | F16K 31/126 |
| 2024/0177991 | A1 * | 5/2024 | Aburatani | C23C 16/402 |
| 2024/0360551 | A1 * | 10/2024 | Yang | C23C 16/4583 |

FOREIGN PATENT DOCUMENTS

| | | | |
|---|---|---|---|
| JP | 2022080642 | A | 5/2022 |
| KR | 101415262 | | 7/2014 |
| KR | 20180082888 | A | 7/2018 |

* cited by examiner

METHOD TO PERFORM IN-SITU VACUUM CONTAMINATION MEASUREMENT AND IDENTIFICATION IN ARBITRARILY LARGE CHAMBERS

CROSS-REFERENCE TO RELATED APPLICATIONS

This application claims priority to U.S. Provisional Patent Application No. 63/538,504, filed Sep. 15, 2023, and U.S. Provisional Patent Application No. 63/675,094, filed Jul. 24, 2024, the disclosures of which are hereby incorporated by reference.

FIELD OF THE DISCLOSURE

This disclosure relates to semiconductor manufacturing, and more particularly to the use of vacuum chambers in fabrication and inspection processes.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a workpiece, such as a semiconductor wafer, using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

To minimize environmental factors that can cause defects in the workpiece, manufacturing processes and inspections processes are often performed in controlled environments, such as an enclosed vacuum chamber. However, even these "clean" environments, contaminants can enter the system when loading and unloading the workpiece, and components inside the chamber can out-gas contaminants themselves. Thus, contamination levels may be continuously monitored to identify conditions that can increase the likelihood of defects being present in a workpiece or reduce inspection accuracy.

A residual gas analyzer (RGA) can be used to measure in-situ contamination of a vacuum chamber. An RGA collects a residual gas sample and measures contamination using an electron ionizer, a quadrupole mass analyzer, and a detector. However, it can be difficult to identify contaminants present in such a small gas fragment from a large and complex chamber. A gas column mass-spectrometry (GCMS) system can also be used to improve detection of contaminants based on molecular weight and variable interaction forces with the column material. However, a GCMS collects a gas sample at elevated temperatures, which may not be feasible due to tight thermal tolerances of an empty chamber or the thermal limits of components present in an occupied chamber.

An ex-situ process using a sample coupon can also be used to measure contamination of a vacuum chamber. The sample coupon can be exposed to the vacuum chamber environment, and then placed in a separate clean chamber and heated to high temperatures to induce outgassing for collection into a sorbent tube. The sorbent tube can then be analyzed using an RGA or GCMS system to identify contaminants. However, this is typically a slow process, as the sample coupon sits in the vacuum chamber for a long duration to transfer contaminants to it. In addition, handling of the sample coupon in and out of the chamber introduces a risk of cross-contamination that can prevent accurate measurements. This risk is increased where the vacuum chamber is located off-site compared to the measurement system, and it is difficult to keep the sample coupon clean during transport.

Therefore, what is needed is an improved method of measuring contamination in a vacuum chamber.

BRIEF SUMMARY OF THE DISCLOSURE

An embodiment of the present disclosure provides a system. The system may comprise a primary vacuum chamber, a secondary vacuum chamber connected to the primary vacuum chamber via a gate valve, wherein the gate valve is operable between an open position in which the secondary vacuum chamber is in fluid communication with the primary vacuum chamber and a closed position in which the secondary vacuum chamber is sealed from the primary vacuum chamber, a heat exchanger, a gas source, and a sample container. The heat exchanger may be configured to cool the secondary vacuum chamber to adsorb contaminants from the primary vacuum chamber into the secondary vacuum chamber when the gate valve is in the open position. The gas source may be configured to inject a carrier gas into the secondary vacuum chamber when the gate valve is in the closed position. The heat exchanger may be further configured to heat the carrier gas in the secondary vacuum chamber to desorb the contaminants into a gas sample with the carrier gas. The sample container may be configured to collect the gas sample from the secondary vacuum chamber.

In some embodiments, the system may further comprise a mass-spectrometer configured to process the gas sample in the sample container to identify the contaminants in the gas sample.

In some embodiments, the carrier gas may comprise an inert gas.

In some embodiments, a gas inlet and a gas outlet may be defined in the secondary vacuum chamber. The gas source may be in fluid communication with the gas inlet to inject the carrier gas into the secondary vacuum chamber, and the sample container may be in fluid communication with the gas outlet to collect the gas sample from the secondary vacuum chamber.

In some embodiments, the gas source may be configured to inject the carrier gas into the secondary vacuum chamber by operation of an inlet valve disposed between the gas source and the gas inlet.

In some embodiments, the sample container may be configured to collect the gas sample from the secondary vacuum chamber by operation of an outlet valve disposed between the sample container and the gas outlet.

In some embodiments, the heat exchanger may be configured to circulate a cooling fluid from a cooling fluid source to cool the secondary vacuum chamber and circulate a heating fluid from a heating fluid source to heat the secondary vacuum chamber.

In some embodiments, the cooling fluid may comprise liquid nitrogen.

In some embodiments, a cooling channel and a heating channel may be defined in the heat exchanger. The cooling channel may be in fluid communication with the cooling fluid source to circulate the cooling fluid, and the heating channel may be in fluid communication with the heating fluid source to circulate the heating fluid.

In some embodiments, a common fluid channel may be defined in the heat exchanger connected to a switching valve. The switching valve may be operable between a cooling position in which the common fluid channel is in fluid communication with the cooling fluid source to circulate the cooling fluid and a heating position in which the common fluid channel is in fluid communication with the heating fluid source to circulate the heating fluid.

In some embodiments, the heat exchanger may comprise a coiled tube wrapped around an outer surface of the secondary vacuum chamber.

In some embodiments, a coiled groove may be defined on the outer surface of the secondary vacuum chamber, and the coiled tube of the heat exchanger may be disposed in the coiled groove.

In some embodiments, the system may further comprise a vacuum pump in fluid communication with the primary vacuum chamber. The vacuum pump may be configured to produce a vacuum pressure in the primary vacuum chamber and the secondary vacuum chamber with the gate valve in the open position.

In some embodiments, the system may further comprise a semiconductor fabrication tool, metrology tool, or inspection tool disposed in the primary vacuum chamber.

In some embodiments, the primary vacuum chamber may be defined in a housing, and the secondary vacuum chamber may be defined in a full nipple fitting connected to the housing via the gate valve.

In some embodiments, the system may further comprise a processor in electronic communication with the gate valve to control operation of the gate valve between the open position and the closed position.

Another embodiment of the present disclosure provides a method. The method may comprise: producing a vacuum pressure in a primary vacuum chamber and a secondary vacuum chamber with a vacuum pump, wherein the secondary vacuum chamber is connected to the primary vacuum chamber via a gate valve, and the secondary vacuum chamber is in fluid communication with the primary vacuum chamber with the gate valve in an open position; cooling the secondary vacuum chamber with a heat exchanger to adsorb contaminants from the primary vacuum chamber into the secondary vacuum chamber; closing the gate valve to seal the secondary vacuum chamber from the primary vacuum chamber; injecting a carrier gas into the secondary vacuum chamber with a gas source; heating the secondary vacuum chamber with the heat exchanger to desorb the contaminants into a gas sample with the carrier gas; and collecting the gas sample from the secondary vacuum chamber into a sample container.

In some embodiments, the method may further comprise processing the gas sample from the sample container with a mass-spectrometer to identify the contaminants.

In some embodiments, cooling the secondary vacuum chamber with the heat exchanger may comprise circulating a cooling fluid from a cooling fluid source through a cooling channel of the heat exchanger.

In some embodiments, heating the secondary vacuum chamber with the heat exchanger may comprise circulating a heating fluid from a heating fluid source through a heating channel of the heat exchanger.

In some embodiments, cooling the secondary vacuum chamber with the heat exchanger may comprise: moving a switching valve to a cooling position in which a cooling fluid source is in fluid communication with a common fluid channel of the heat exchanger; and circulating a cooling fluid from the cooling fluid source through the common fluid channel of the heat exchanger.

In some embodiments, heating the secondary vacuum chamber with the heat exchanger may comprise: moving the switching valve to a heating position in which a heating fluid source is in fluid communication with the common fluid channel of the heat exchanger; and circulating a heating fluid from the heating fluid source through the common fluid channel of the heat exchanger.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

An embodiment of the present disclosure provides a system 100. The system 100 may be a semiconductor manufacturing, etch-deposition, inspection, or metrology system configured to process a workpiece. The workpiece may be, for example, a photomask (reticle), a semiconductor wafer, substrate, printed circuit board (PCB), integrated circuit (IC), flat panel display (FPD), or other type of workpiece.

Figure 1A:
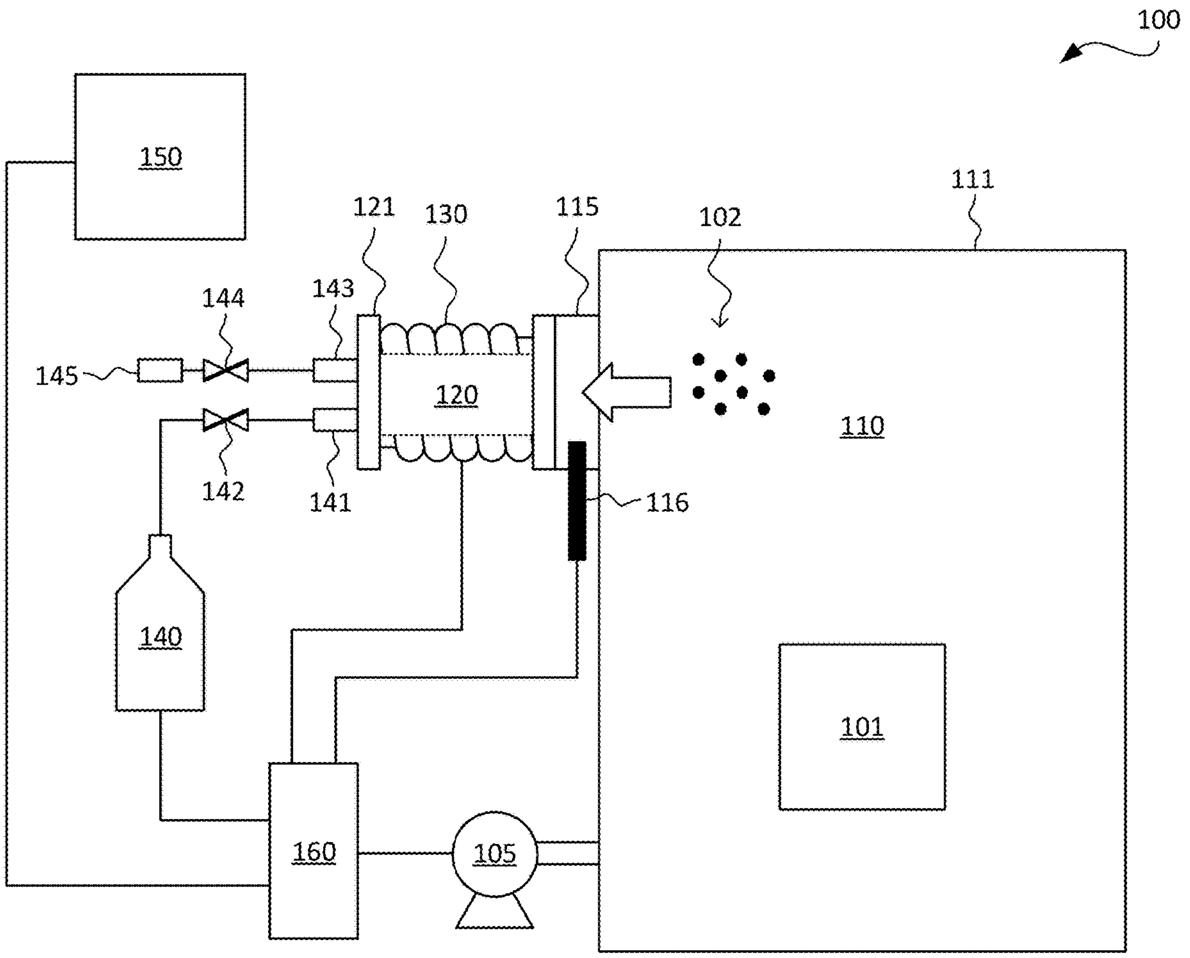
FIG. 1A is a diagram of a system according to an embodiment of the present disclosure, in which a gate valve is in an open position.
Figure 1B:
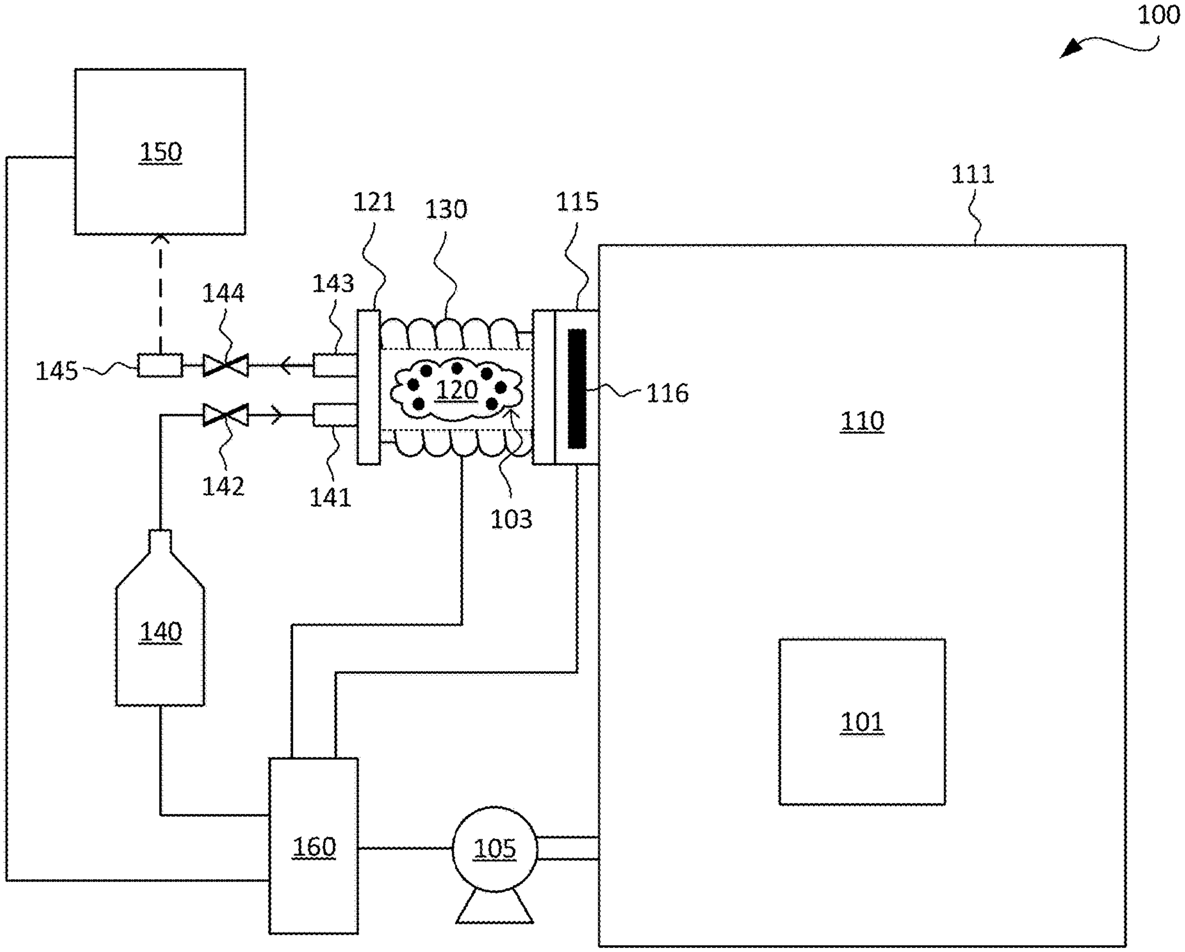
FIG. 1B is a diagram of the system of FIG. 1A, in which the gate valve is in a closed position.

The system 100 may comprise a primary vacuum chamber 110, as shown in FIG. 1A and FIG. 1B. The primary vacuum chamber 110 may be defined in a housing 111 and may have an arbitrarily large size and shape that is not limited herein. An instrument 101 may be disposed within the primary vacuum chamber 110. The instrument 101 may be a metrology tool, an inspection tool, fabrication tool, or other type of instrument used in a semiconductor manufacturing, inspection, or metrology system to process a workpiece.

The system 100 may further comprise a secondary vacuum chamber 120. The secondary vacuum chamber 120 may be connected to the primary vacuum chamber 110 via a gate valve 115. In some embodiments, the secondary vacuum chamber 120 may be defined in a full nipple fitting 121 connected to the housing 111 via the gate valve 115. The full nipple fitting 121 may be connected to the housing 111 at an existing outlet port or at an outlet port produced for connecting to the full nipple fitting 121. The full nipple fitting 121 may have a flange arranged at one end for connection to the housing 111. For example, one or more fasteners may secure the flange to the housing 111, and the gate valve 115 may be sandwiched between the flange and the housing 111. The other end of the full nipple fitting 121 may have another flange, and may be closed to define the secondary vacuum chamber between the two flanges. In some embodiments, the full nipple fitting 121 may have a diameter of 1.33 inches to 10 inches.

The gate valve 115 may be operable between an open position (shown in FIG. 1A) and a closed position (shown in FIG. 1B). For example, in the open position, a gate 116 of the gate valve 115 may be positioned such that the secondary vacuum chamber 120 is in fluid communication with the primary vacuum chamber 110. In the closed position, the gate 116 of the gate valve 115 may be positioned such the secondary vacuum chamber 120 is sealed from the primary vacuum chamber 110. The gate valve 115 may comprise any suitable valve configured to be operable between an open position and a closed position to selectively open and seal fluid communication between the primary vacuum chamber 110 and the secondary vacuum chamber 120, and is not limited to a particular valve having a gate or the exemplary structure shown in FIG. 1A or FIG. 1B. For example, the gate valve 115 may be a pendulum valve, a butterfly valve, or any other type of vacuum isolation valve.

The system 100 may further comprise a vacuum pump 105. The vacuum pump 105 may be in fluid communication with the primary vacuum chamber 110. When the gate valve 115 is in the open position, the vacuum pump 105 may be further in fluid communication with the secondary vacuum chamber 120, via the primary vacuum chamber 110. The vacuum pump 105 may be configured to produce a vacuum pressure in the primary vacuum chamber 110 and the secondary vacuum chamber 120 with the gate valve 115 in the open position. The vacuum pressure may be in a high vacuum to ultra-high vacuum range. For example, the pressure may be in a range of 10s of millitorr ($1e^{-3}$ Torr) to 10s of nanoTorr ($1e^{-8}$ Torr)

Figure 2A:
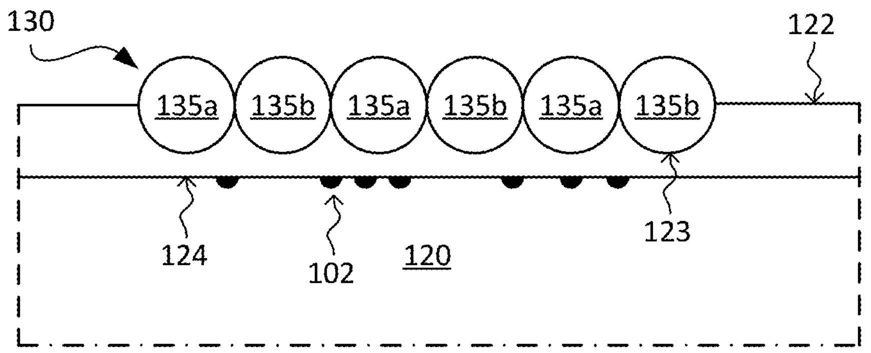
FIG. 2A is a partial section view of an interface between a secondary vacuum chamber and a heat exchanger of a system according to an embodiment of the present disclosure.
Figure 3A:
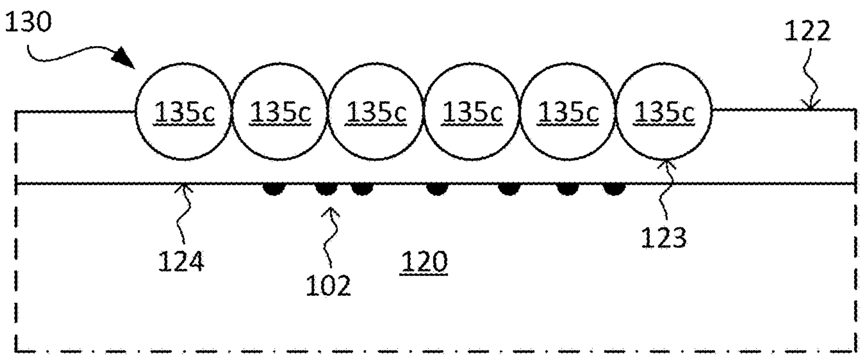
FIG. 3A is a partial section view of an interface between a secondary vacuum chamber and a heat exchanger of a system according to another embodiment of the present disclosure.

The system 100 may further comprise a heat exchanger 130. The heat exchanger 130 may be configured to cool the secondary vacuum chamber 120. For example, the heat exchanger 130 may comprise a coiled tube wrapped around an outer surface 122 of the secondary vacuum chamber 120. In some embodiments, the coiled tube may be comprised of copper. In some embodiments, a coiled groove 123 may be defined on the outer surface 122 of the secondary vacuum chamber 120, and the coiled tube of the heat exchanger 130 may be disposed in the coiled groove 123 (as shown in FIG. 2A and FIG. 3A). Such an arrangement may increase the surface contact between the heat exchanger 130 and the secondary vacuum chamber 120 which can improve cooling effect. When the gate valve 115 is in the open position (as shown in FIG. 1A) and the heat exchanger 130 cools the secondary vacuum chamber 120, contaminants 102 from the primary vacuum chamber 110 may be adsorbed into the secondary vacuum chamber 120. For example, an inner surface 124 of the secondary vacuum chamber 120 may act as a cold trap, such that the contaminants 102 may become attracted to and embedded on the inner surface 124 of the secondary vacuum chamber 120. The trapping efficiency of the inner surface 124 of the secondary vacuum chamber 120 may be proportional to the temperature. For example, the temperature may range from 0° C. to liquid nitrogen temperatures (i.e., −196° C. or less). The contaminants 102 may be any volatile organic compounds (VOCs) or volatile inorganic compounds present in the residual gas of the primary vacuum chamber 110 or outgassed by the components inside the primary vacuum chamber 110. After being in the open position for a fixed duration, the gate valve 115 can then be moved to the closed position (as shown in FIG. 1B) to seal the contaminants 102 in the secondary vacuum chamber 120. The length of time may depend on the temperature. For example, the gate valve 115 may remain in the open position overnight to a few days for a temperature of 0° C., while the gate valve 115 may remain in the open position for only a few hours for a liquid nitrogen temperature for adequate cold trapping effects.

The system 100 may further comprise a gas source 140. The gas source 140 may be configured to inject a carrier gas into the secondary vacuum chamber 120. For example, when the gate valve 115 is in the closed position, the gas source 140 may inject the carrier gas into the secondary vacuum chamber 120. The carrier gas may be an inert gas, such as nitrogen ($N_2$) gas, argon, helium, clean dry air (CDA), or other types of gases and is not limited herein. A gas inlet 141 may be defined in the secondary vacuum chamber 120, and the gas source 140 may be in fluid communication with the gas inlet 141 in order to inject the carrier gas into the secondary vacuum chamber 120. In some embodiments, the carrier gas may be pressurized in the gas source 140, such that opening an inlet valve 142 causes the carrier gas to be injected into the secondary vacuum chamber 120 via the gas inlet 141. In some embodiments, the gas inlet 141 may be provided at the closed end of the full nipple fitting 121 away from the housing 111. The gas source 140 may further include a mass flow controller and/or a purifier to control the flow rate and purity of the carrier gas injected into the secondary vacuum chamber 120.

The heat exchanger 130 may be further configured to heat the secondary vacuum chamber 120. For example, the heat exchanger 130 may be configured to heat the carrier gas in the secondary vacuum chamber 120 to desorb the contaminants 102 embedded on the inner surface 124 of the secondary vacuum chamber 120 into a gas sample 103 with the carrier gas. In some embodiments, the heat exchanger 130 may be configured to heat the secondary vacuum chamber 120 to a temperature of 50° C. to 300° C. or more. The rate of desorption may be proportional to the temperature. For example, a higher temperature may result in faster desorption of the contaminants 102. The temperature may be limited by the melting points of the materials present in the secondary vacuum chamber 120. In some embodiments, the heat exchanger 130 can heat the secondary vacuum chamber 120 to a temperature of up to 300° C. as a pre-clean process to desorb any existing contaminants from the inner surface 124 of the vacuum chamber 120 before collecting contaminants 102 from the primary vacuum chamber 110. The heat exchanger 130 may heat the secondary vacuum chamber 120 for a preset duration after reaching a target temperature. The length of time may depend on the temperature. For example, the heat exchanger 130 may heat the secondary vacuum chamber 120 for a few days at a lower temperature, while the heat exchanger 130 may heat the secondary vacuum chamber 120 for only a few hours for adequate desorption.

The system 100 may further comprise a sample container 145. The sample container 145 may be a sorbent tube or other gas vessel. The sample container 145 may be configured to collect the gas sample 103 from the secondary vacuum chamber 120. A gas outlet 143 may be defined in the secondary vacuum chamber 120, and the sample container 145 may be in fluid communication with the gas outlet 143 to collect the gas sample 103 from the secondary vacuum chamber 120. In some embodiments, the gas outlet 143 may be provided at the closed end of the full nipple fitting 121 away from the housing 111. In some embodiments, an outlet valve 144 can be opened to cause the gas sample 103 to exit the secondary vacuum chamber 120 into the sample container 145.

The system 100 may further comprise a mass-spectrometer 150. The mass-spectrometer 150 may be part of a standalone system or a GCMS instrument. The mass-spectrometer 150 may be configured to receive the sample container 145 to identify the contaminants 102 in the gas sample 103. In particular, the mass-spectrometer 150 may be configured to perform species identification or molecular identification of the contaminants 102 in the gas sample 103 based on the elevated temperature of the gas sample 103 induced by the heat exchanger 130 in the secondary vacuum chamber 120. With the contaminants 102 concentrated in the sample container 145 at high temperature, detection and identification using the mass-spectrometer 150 can be improved. The mass-spectrometer 150 may be separated from the secondary vacuum chamber 120 and the other elements of the system 100. For example, the sample container 145 may be transported to the mass-spectrometer 150 by automated (e.g., robot arm) or manual means.

The system 100 may further comprise a processor 160. The processor 160 may include a microprocessor, a microcontroller, or other devices. The processor 160 may be coupled to the components of the system 100 in any suitable manner (e.g., via one or more transmission media, which may include wired and/or wireless transmission media) such that the processor 160 can receive output. The processor 160 may be configured to perform a number of functions using the output. An inspection tool can receive instructions or other information from the processor 160. The processor 160 optionally may be in electronic communication with another inspection tool, a metrology tool, a repair tool, or a review tool (not illustrated) to receive additional information or send instructions.

The processor 160 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 160 may be disposed in or otherwise part of the system 100 or another device. In an example, the processor 160 may be part of a standalone control unit or in a centralized quality control unit. Multiple processors 160 may be used, defining multiple subsystems of the system 100.

The processor 160 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 160 to implement various methods and functions may be stored in readable storage media, such as a memory.

If the system 100 includes more than one subsystem, then the different processors 160 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 160 may be configured to perform a number of functions using the output of the system 100 or other output. For instance, the processor 160 may be configured to send the output to an electronic data storage unit or another storage medium. The processor 160 may be further configured as described herein.

The processor 160 may be configured according to any of the embodiments described herein. The processor 160 also may be configured to perform other functions or additional steps using the output of the system 100 or using images or data from other sources.

The processor 160 may be communicatively coupled to any of the various components or sub-systems of system 100 in any manner known in the art. Moreover, the processor 160 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 160 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random-access memory, a magnetic or optical disk, a non-volatile memory, a solid-state memory, a magnetic tape, and the like. A carrier medium may include a transmission medium such as a wire, cable, or wireless transmission link. For instance, the various steps described throughout the present disclosure may be carried out by a single processor 160 (or computer subsystem) or, alternatively, multiple processors 160 (or multiple computer subsystems). Moreover, different sub-systems of the system 100 may include one or more computing or logic systems. Therefore, the above description should not be interpreted as a limitation on the present disclosure but merely an illustration.

The processor 160 may be in electronic communication with the vacuum pump 105. For example, the processor 160 may be configured to control operation of the vacuum pump 105 to produce a vacuum pressure in the primary vacuum chamber 110 and the secondary vacuum chamber 120 with the gate valve 115 in the open position.

The processor 160 may be in electronic communication with the gate valve 115. For example, the processor 160 may be configured to control operation of the gate valve 115 between the open position and the closed position.

The processor 160 may be in electronic communication with the heat exchanger 130. For example, the processor 160 may be configured to control operation of the heat exchanger 130 to cool and heat the secondary vacuum chamber 120.

The processor 160 may be in electronic communication with the gas source 140. For example, the processor 160 may be configured to control operation of the inlet valve 142 to inject the carrier gas into from the gas source 140 into the secondary vacuum chamber 120 via the gas inlet 141.

The processor 160 may be in electronic communication with the mass-spectrometer 150. For example, the processor 160 may be configured to control operation of the outlet valve 144 to collect the gas sample 103 from the secondary vacuum chamber 120 into the sample container 145 via the gas outlet 143, and the processor 160 may be configured to control the mass-spectrometer to process the gas sample 103 in the sample container 145 to identify the contaminants 102 in the gas sample 103.

Figure 2B:
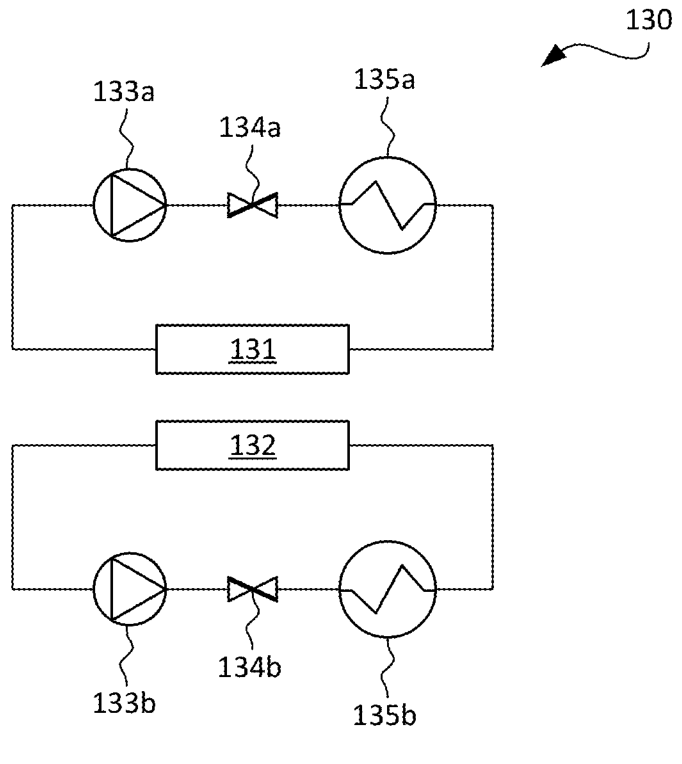
FIG. 2B is a hydraulic diagram of the heat exchanger of FIG. 2A.

In some embodiments, separate fluid channels may be defined in the heat exchanger 130 to cool and heat the secondary vacuum chamber 120. For example, a cooling channel 135*a* and a heating channel 135*b* may be defined in the heat exchanger 130, as shown in FIG. 2A and FIG. 2B. The cooling channel 135*a* may be in fluid communication with a cooling fluid source 131, and the heating channel 135*b* may be in fluid communication with a heating fluid source 132. The heat exchanger 130 may be configured to circulate a cooling fluid from the cooling fluid source 131 through the cooling channel 135*a* to cool the secondary vacuum chamber 120 and adsorb contaminants 102 from the primary vacuum chamber 110 into the secondary vacuum chamber 120. In some embodiments, the cooling fluid may comprise, for example, liquid nitrogen, chilled water, ethylene glycol solution, or the like. The heat exchanger 130 may be further configured to circulate a heating fluid from the heating fluid source 132 through the heating channel 135*b* to heat the secondary vacuum chamber 120 and desorb the contaminants 102 into a gas sample 103 with the carrier gas. In some embodiments, the heating fluid may comprise, for example, hot water, steam, or other fluids. As shown in FIG. 2A, the cooling channel 135*a* and the heating channel 135*b* of the heat exchanger 130 may be alternately arranged along the outer surface 122 of the secondary vacuum chamber 120. As shown in FIG. 2B, the heat exchanger 130 may further comprise a cooling fluid pump 133*a* and a cooling fluid valve 134*a* configured to circulate the cooling fluid from the cooling fluid source 131 through the cooling channel 135*a*, and the heat exchanger 130 may further comprise a heating fluid pump 133*b* and a heating fluid valve 134*b* configured to circulate the heating fluid from the heating fluid source 132 through the heating channel 135*b*. In some embodiments, the processor 160 may be configured to control operation of the cooling fluid pump 133*a* and/or the cooling fluid valve 134*a* to control the heat exchanger 130 to cool the secondary vacuum chamber 120, and the processor 160 may be further configured to control operation of the heating fluid pump 133*b* and/or the heating fluid valve 134*b* to control the heat exchanger 130 to heat the secondary vacuum chamber 120. In some embodiments, the heat exchanger 130 may comprise an electric heater configured to heat the secondary vacuum chamber 120 and operates similar to circulation of heating fluid. The electric heater may be wrapped around the full nipple fitting 121. The electric heater may utilize heat tape or resistive heating to generate hat to desorb the contaminants 102 into the gas sample 103.

Figure 3B:
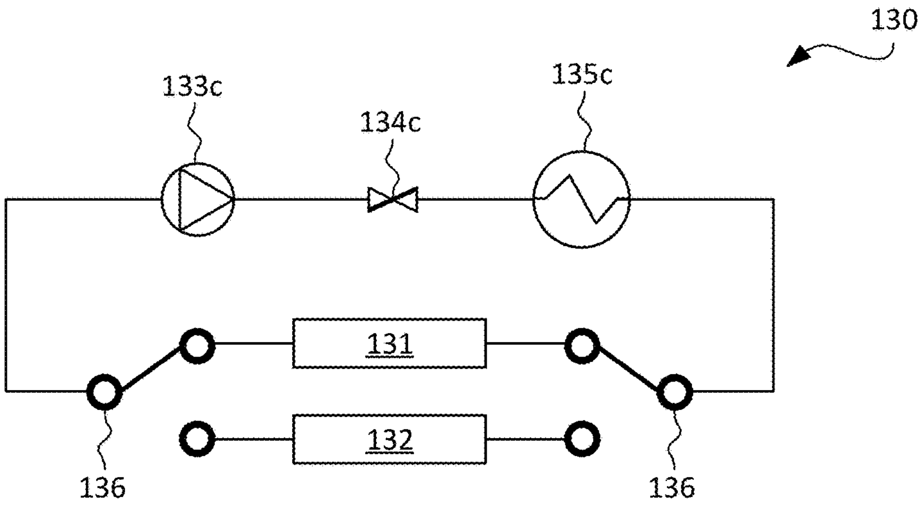
FIG. 3B is a hydraulic diagram of the heat exchanger of FIG. 3A, in which a switching valve is in a cooling position.
Figure 3C:
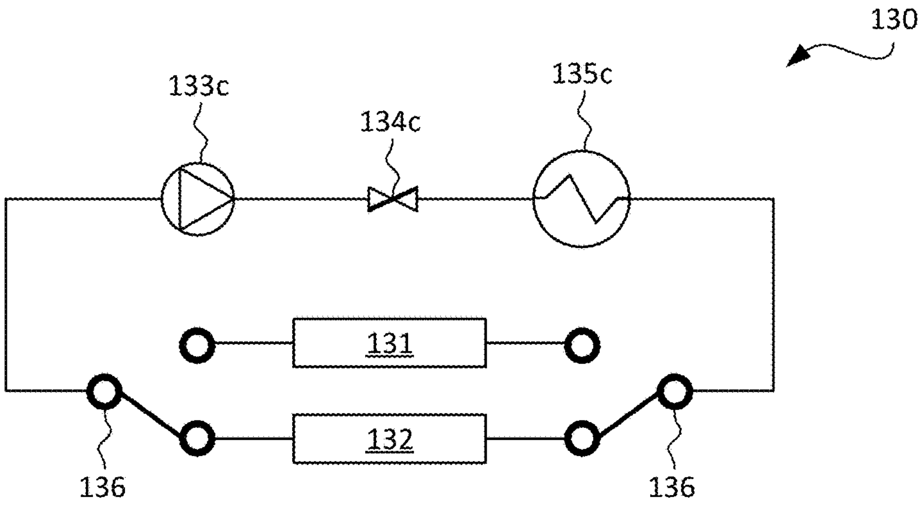
FIG. 3C is a hydraulic diagram of the heat exchanger of FIG. 3A, in which the switching valve is in a heating position.

In some embodiments, a single fluid channel may be defined in the heat exchanger 130 to cool and heat the secondary vacuum chamber 120. For example, a common fluid channel 135*c* may be defined in the heat exchanger 130, as shown in FIG. 3A, FIG. 3B, and FIG. 3C. The common fluid channel 135*c* may be in fluid communication with the cooling fluid source 131 and the heating fluid source 132 under operation of a switching valve 136 that is operable between a cooling position and a heating position. For example, in the cooling position (shown in FIG. 3B), the common fluid channel 135*c* may be in fluid communication with the cooling fluid source 131 to circulate the cooling fluid and cool the secondary vacuum chamber 120 to adsorb contaminants 102 from the primary vacuum chamber 110 into the secondary vacuum chamber 120. In the heating position (shown in FIG. 3C), the common fluid channel 135*c* may be in fluid communication with the heating fluid source 132 to circulate the heating fluid and heat the secondary vacuum chamber 120 to desorb the contaminants 102 into a gas sample 103 with the carrier gas. The switching valve 136 may comprise any suitable valve configured to be operable between a cooling position and a heating position to selectively open and seal fluid communication between the common fluid channel 135*c* and one of the cooling fluid source 131 and the heating fluid source 132. As shown in FIG. 3A, the common fluid channel 135*c* may be wrapped around the outer surface 122 of the secondary vacuum chamber 120. As shown in FIG. 3B an FIG. 3C, the heat exchanger 130 may further comprise a common fluid pump 133*c* and a common fluid valve 134*c* configured to circulate the cooling fluid from the cooling fluid source 131 and circulate the heating fluid from the heating fluid source 132 depending on the position of the switching valve 136. In some embodiments, the processor 160 may be configured to control operation of the switching valve 136 between the cooling position and the heating position. The processor 160 may be further configured to control the common fluid pump 133*c* and/or the common fluid valve 134*c* to control the heat exchanger 130 to cool the secondary vacuum chamber 120 with the switching valve 136 in the cooling position, and the processor 160 may be further configured to control operation of the common fluid pump 133*c* and/or the common fluid valve 134*c* to control the heat exchanger 130 to heat the secondary vacuum chamber 120 with the switching valve 136 in the heating position.

In some embodiments, the system 100 may be a dedicated contamination testing system. For example, the system may be configured to process a particular workpiece under test, with the contaminants 102 identified in the gas sample 103 being those outgassed by the workpiece, to define a contaminant profile for the workpiece.

With the system 100, the contaminants 102 from the primary vacuum chamber 110 can be collected in the secondary vacuum chamber 120 by a cold trap from the heat exchanger 130 in an efficient manner with reduced collection time. The heat exchanger 130 may be further able to heat the secondary vacuum chamber 120 without heating the primary vacuum chamber 110, which could adversely affect machined tolerances or critical assemblies of components in the primary vacuum chamber 110 that have low operation temperature limits. The higher temperature gas sample 103 can allow for higher resolution in-situ contamination measurements with the mass-spectrometer 150, which can identify the contaminants 102 on a species or molecular basis. The system 100 can also be applied with a primary vacuum chamber 110 having any size, geometry, or occupation state (i.e., empty or containing components) to $1\times10^{-14}$ Torr partial pressure or better. Consequently, the system 100 may reduce the number of defects caused by contamination and improve inspection quality. The system 100 may also limit overall contamination, as the primary vacuum chamber 110 can remain sealed during test. This can limit transmission loss and help keep up availability of tools, which would reduce costs of ownership and maintenance.

Figure 4:
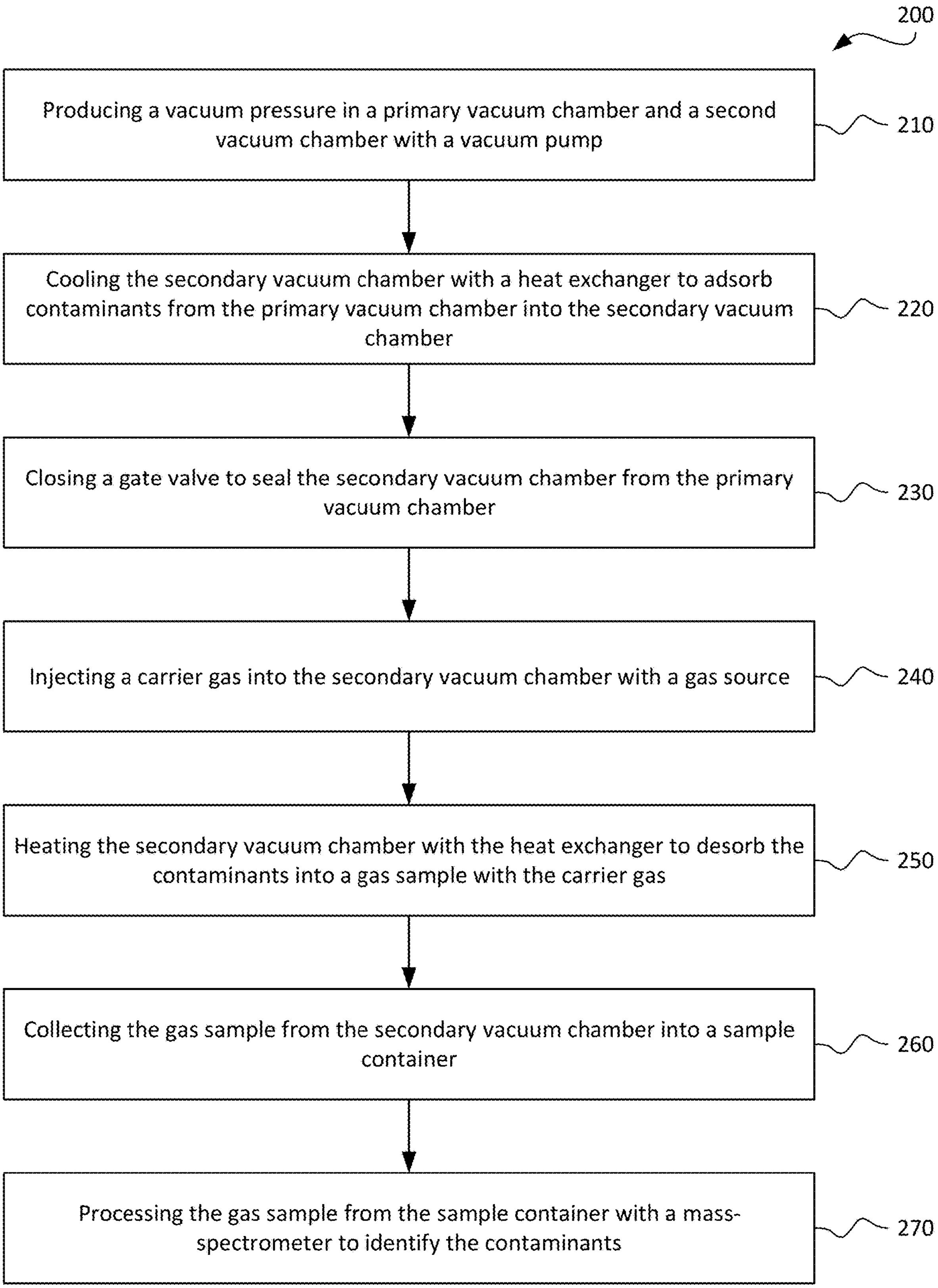
FIG. 4 is a flowchart of a method according to an embodiment of the present disclosure.

Another embodiment of the present disclosure provides a method 200. As shown in FIG. 4, the method 200 may comprise the following steps.

At step 210, a vacuum pressure is produced in a primary vacuum chamber and a second vacuum chamber with a vacuum pump. The primary vacuum chamber may be defined in a housing having an arbitrarily large size and shape that is not limited herein. An instrument may be disposed within the primary vacuum chamber, such as, for example, a metrology tool, an inspection tool, fabrication tool, or other type of instrument used in a semiconductor manufacturing, inspection, or metrology system. The secondary vacuum chamber may be defined in a full nipple fitting connected to the housing, and a gate valve may be sandwiched between the full nipple fitting and the housing. The vacuum pump may be in fluid communication with the primary vacuum chamber, and when the gate valve is in an open position, the vacuum pump may be further in fluid communication with the secondary vacuum chamber. The vacuum pressure may be in a high vacuum to ultra-high vacuum range. For example, the pressure may be in a range of 10s of millitorr ($1e^{-3}$ Torr) to 10s of nanoTorr ($1e^{-8}$ Torr).

At step 220, the secondary vacuum chamber is cooled with a heat exchanger to adsorb contaminants from the primary vacuum chamber into the secondary vacuum chamber. For example, the heat exchanger may be configured to cool an outer surface of the secondary vacuum chamber, such that an inner surface of the secondary vacuum chamber acts as a cold trap to attract contaminants from the primary vacuum chamber. The heat exchanger may cool the secondary vacuum chamber for a fixed duration for collection of the contaminants. For example, the cooling temperature may range from 0° C. to liquid nitrogen temperatures (i.e., −196° C. or less).

At step 230, a gate valve is closed to seal the secondary vacuum chamber from the primary vacuum chamber. For example, the gate valve may be operable between an open position and a closed position. In the open position, a gate of the gate valve may be positioned such that the secondary vacuum chamber is in fluid communication with the primary vacuum chamber. In the closed position, the gate of the gate valve may be positioned such that the secondary vacuum chamber is sealed from the primary vacuum chamber. The gate valve may comprise any suitable valve configured to be operable between an open position and a closed position to selectively open and seal fluid communication between the primary vacuum chamber and the secondary vacuum chamber. For example, the gate valve 115 may be a pendulum valve, a butterfly valve, or any other type of vacuum isolation valve. By closing the gate valve, the contaminants adsorbed from the primary vacuum chamber may be trapped within the secondary vacuum chamber.

At step 240, a carrier gas is injected into the secondary vacuum chamber with a gas source. For example, the carrier gas may be injected into a gas inlet of the secondary vacuum chamber from the gas source. The carrier gas may be pressurized in the gas source, such that opening an inlet valve causes the carrier gas to be injected into the secondary vacuum chamber. In some embodiments, the carrier gas may be an inert gas, such as nitrogen ($N_2$) gas, argon, helium, clean dry air (CDA), or other types of gases and is not limited herein.

At step 250, the secondary vacuum chamber is heated with the heat exchanger to desorb the contaminants into a gas sample with the carrier gas. For example, the heat exchanger may be configured to heat the outer surface of the secondary vacuum chamber, such that the contaminants are desorbed from the inner surface of the secondary vacuum chamber into a gas sample with the carrier gas. The heat exchanger may heat the secondary vacuum temperature for a preset duration after reaching a target temperature. For example, the heat exchanger may be configured to heat the secondary vacuum chamber to a temperature of 50 to 300° C. or more. Such elevated temperatures may improve the ability of a mass-spectrometer to identify species and molecules in the contaminants.

At step 260, the gas sample is collected from the secondary vacuum chamber into a sample container. For example, the gas sample can be collected from a gas outlet of the secondary vacuum chamber into a sample container by opening an outlet valve.

At step 270, the gas sample from the sample container is processed using a mass-spectrometer to identify the contaminants. For example, the mass-spectrometer may be configured to perform species identification or molecular identification of the contaminants in the gas sample based on the elevated temperature of the gas sample induced by the heat exchanger in the secondary vacuum chamber. The mass-spectrometer may be part of a standalone system or a GCMS instrument.

Figure 5:
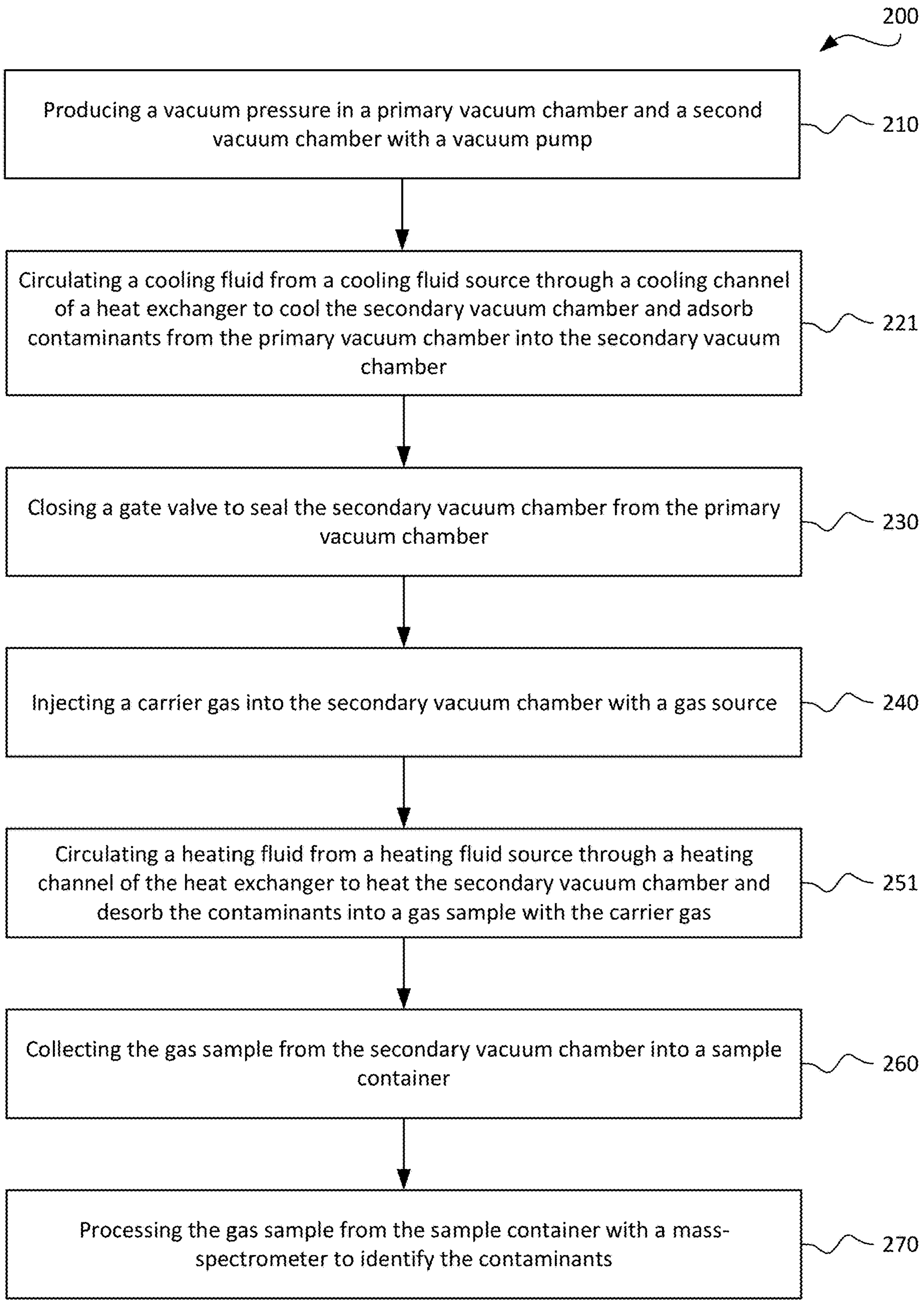
FIG. 5 is a flowchart of a method according to another embodiment of the present disclosure.

In some embodiments, separate fluid channels may be defined in the heat exchanger that are configured to cool and heat the secondary vacuum chamber. Accordingly, steps 220 and 250 of the method 200 may be replaced with the following steps, as shown in FIG. 5.

At step 221, a cooling fluid is circulated from a cooling fluid source through a cooling channel of the heat exchanger to cool the secondary vacuum chamber and adsorb contaminants from the primary vacuum chamber into the secondary vacuum chamber. In some embodiments, the cooling fluid may comprise liquid nitrogen. The heat exchanger may further comprise a cooling fluid pump and a cooling fluid valve configured to circulate the cooling fluid from the cooling fluid source through the cooling channel.

At step 251, a heating fluid is circulated from a heating fluid source through a heating channel of the heat exchanger to heat the secondary vacuum chamber and desorb the contaminants into a gas sample with the carrier gas. In some embodiments, the heating fluid may comprise hot water. The heat exchanger may further comprise a heating fluid pump and a heating fluid valve configured to circulate the heating fluid from the heating fluid source through the heating channel.

Figure 6A:
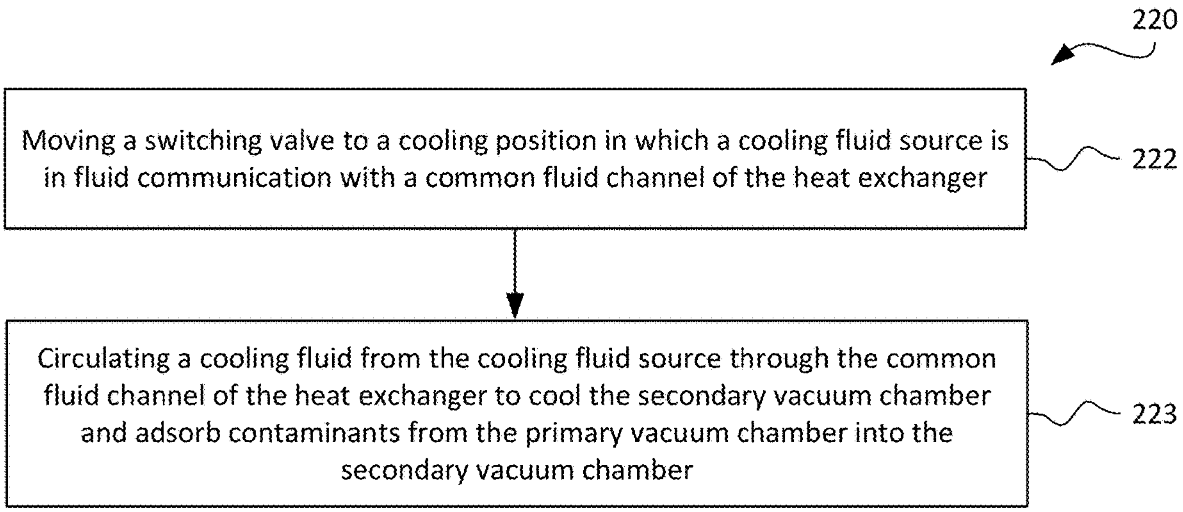
FIG. 6A is a flowchart of a method according to another embodiment of the present disclosure.
Figure 6B:
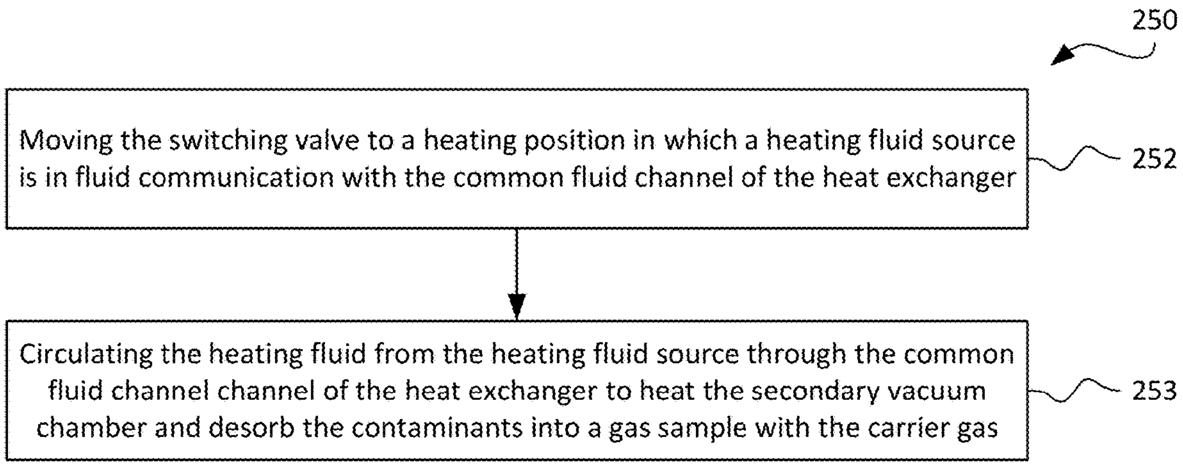
FIG. 6B is a flowchart of a method according to another embodiment of the present disclosure.

In some embodiments, a single fluid channel may be defined in the heat exchanger that is configured to cool and heat the secondary vacuum chamber, and a switching valve may be configured to change between cooling and heating functions. The switching valve may comprise any suitable valve configured to be operable between a cooling position and a heating position to selectively open and seal fluid communication between the common fluid channel and one of the cooling fluid source and the heating fluid source. Accordingly, step 220 of the method 200 may comprise the following steps shown in FIG. 6A, and step 250 of the method 200 may comprise the following steps shown in FIG. 6B.

At step 222, the switching valve is moved to a cooling position in which a cooling fluid source is in fluid communication with a common fluid channel of the heat exchanger.

At step 223, a cooling fluid is circulated from the cooling fluid source through the common fluid channel of the heat exchanger to cool the secondary vacuum chamber and adsorb contaminants from the primary vacuum chamber into the secondary vacuum chamber. The heat exchanger may further comprise a common fluid pump and a common fluid valve configured to circulate the cooling fluid from the cooling fluid source when the switching valve is in the cooling position.

At step 252, the switching valve is moved to a heating position in which a heating fluid source is in fluid communication with the common fluid channel of the heat exchanger.

At step 253, a heating fluid is circulated from the heating fluid source through the common fluid channel of the heat exchanger to heat the secondary vacuum chamber and desorb the contaminants into a gas sample with the carrier gas. The common fluid pump and the common fluid valve of the heat exchanger may be further configured to circulate the heating fluid from the heating fluid source when the switching valve is in the heating position.

With the method 200, the contaminants from the primary vacuum chamber can be collected in the secondary vacuum chamber by a cold trap from the heat exchanger in an efficient manner with reduced collection time. The heat exchanger may be further able to heat the secondary vacuum chamber without heating the primary vacuum chamber, which could adversely affect machined tolerances or critical assemblies of components in the primary vacuum chamber that have low operation temperature limits. The higher temperature gas sample can allow for higher resolution in-situ contamination measurements with the mass-spectrometer, which can identify the contaminants on a species or molecular basis. The system can also be applied with a primary vacuum chamber having any size, geometry, or occupation state (i.e., empty or containing components) to $1\times10^{-14}$ Torr partial pressure or better. Consequently, the method 200 may reduce the number of defects caused by contamination and improve inspection quality.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

a primary vacuum chamber;

a secondary vacuum chamber connected to the primary vacuum chamber via a gate valve, wherein the gate valve is operable between an open position in which the secondary vacuum chamber is in fluid communication with the primary vacuum chamber and a closed position in which the secondary vacuum chamber is sealed from the primary vacuum chamber;

a vacuum pump in fluid communication with the primary vacuum chamber, wherein the vacuum pump is configured to produce a vacuum pressure in the primary vacuum chamber and the secondary vacuum chamber with the gate valve in the open position and to produce the vacuum pressure in the primary vacuum chamber with the gate valve in the closed position;

a heat exchanger configured to cool the secondary vacuum chamber to adsorb contaminants from the primary vacuum chamber into the secondary vacuum chamber when the gate valve is in the open position;

a gas source configured to inject a carrier gas into the secondary vacuum chamber when the gate valve is in the closed position, wherein the heat exchanger is further configured to heat the carrier gas in the secondary vacuum chamber to desorb the contaminants into a gas sample with the carrier gas; and a sample container configured to collect the gas sample from the secondary vacuum chamber.

2. The system of claim 1, further comprising:

a mass-spectrometer configured to process the gas sample in the sample container to identify the contaminants in the gas sample.

3. The system of claim 1, wherein the carrier gas comprises an inert gas.

4. The system of claim 1, wherein a gas inlet and a gas outlet are defined in the secondary vacuum chamber, the gas source being in fluid communication with the gas inlet to inject the carrier gas into the secondary vacuum chamber, and the sample container being in fluid communication with the gas outlet to collect the gas sample from the secondary vacuum chamber.

5. The system of claim 4, wherein the gas source is configured to inject the carrier gas into the secondary vacuum chamber by operation of an inlet valve disposed between the gas source and the gas inlet.

6. The system of claim 4, wherein the sample container is configured to collect the gas sample from the secondary vacuum chamber by operation of an outlet valve disposed between the sample container and the gas outlet.

7. The system of claim 1, wherein the heat exchanger is configured to circulate a cooling fluid from a cooling fluid source to cool the secondary vacuum chamber and circulate a heating fluid from a heating fluid source to heat the secondary vacuum chamber.

8. The system of claim 7, wherein the cooling fluid comprises liquid nitrogen.

9. The system of claim 7, wherein a cooling channel and a heating channel are defined in the heat exchanger, the cooling channel being in fluid communication with the cooling fluid source to circulate the cooling fluid, and the heating channel being in fluid communication with the heating fluid source to circulate the heating fluid.

10. The system of claim 7, wherein a common fluid channel is defined in the heat exchanger connected to a switching valve, and the switching valve is operable between a cooling position in which the common fluid channel is in fluid communication with the cooling fluid source to circulate the cooling fluid and a heating position in which the common fluid channel is in fluid communication with the heating fluid source to circulate the heating fluid.

11. The system of claim 1, wherein the heat exchanger comprises a coiled tube wrapped around an outer surface of the secondary vacuum chamber.

12. The system of claim 11, wherein a coiled groove is defined on the outer surface of the secondary vacuum chamber, and the coiled tube of the heat exchanger is disposed in the coiled groove.

13. The system of claim 1, further comprising:

a semiconductor fabrication tool, metrology tool, or inspection tool disposed in the primary vacuum chamber.

14. The system of claim 1, wherein the primary vacuum chamber is defined in a housing, and the secondary vacuum chamber is defined in a full nipple fitting connected to the housing via the gate valve.

15. The system of claim 1, further comprising:

a processor in electronic communication with the gate valve to control operation of the gate valve between the open position and the closed position.

16. A method comprising:

providing a primary vacuum chamber and a secondary vacuum chamber, wherein the secondary vacuum chamber is connected to the primary vacuum chamber via a gate valve;

producing a vacuum pressure in a primary vacuum chamber with a vacuum pump when the gate valve is in a closed position;

producing the vacuum pressure in the primary vacuum chamber and the secondary vacuum chamber with the vacuum pump when the gate valve is in an open position, wherein the secondary vacuum chamber is in fluid communication with the primary vacuum chamber with the gate valve in the open position;

cooling the secondary vacuum chamber with a heat exchanger to adsorb contaminants from the primary vacuum chamber into the secondary vacuum chamber;

closing the gate valve to seal the secondary vacuum chamber from the primary vacuum chamber;

injecting a carrier gas into the secondary vacuum chamber with a gas source;

heating the secondary vacuum chamber with the heat exchanger to desorb the contaminants into a gas sample with the carrier gas; and collecting the gas sample from the secondary vacuum chamber into a sample container.

17. The method of claim 16, further comprising:

processing the gas sample from the sample container with a mass-spectrometer to identify the contaminants.

18. The method of claim 16, wherein:

cooling the secondary vacuum chamber with the heat exchanger comprises:

circulating a cooling fluid from a cooling fluid source through a cooling channel of the heat exchanger; and heating the secondary vacuum chamber with the heat exchanger comprises:

circulating a heating fluid from a heating fluid source through a heating channel of the heat exchanger.

19. The method of claim 16, wherein:

cooling the secondary vacuum chamber with the heat exchanger comprises:

moving a switching valve to a cooling position in which a cooling fluid source is in fluid communication with a common fluid channel of the heat exchanger; and circulating a cooling fluid from the cooling fluid source through the common fluid channel of the heat exchanger; and heating the secondary vacuum chamber with the heat exchanger comprises:

moving the switching valve to a heating position in which a heating fluid source is in fluid communication with the common fluid channel of the heat exchanger; and circulating a heating fluid from the heating fluid source through the common fluid channel of the heat exchanger.

* * * * *